United States Patent [19]

Alferness et al.

[11] Patent Number: 4,904,045
[45] Date of Patent: Feb. 27, 1990

[54] GRATING COUPLER WITH MONOLITHICALLY INTEGRATED QUANTUM WELL INDEX MODULATOR

[75] Inventors: Rodney C. Alferness, Holmdel; Thomas L. Koch, Middletown; Uziel Koren, Fairhaven; Jane E. Zucker, Aberdeen, all of N.J.

[73] Assignees: American Telephone and Telegraph Company, New York, N.Y.; AT&T Bell Laboratories, Murray Hill, N.J.

[21] Appl. No.: 173,503

[22] Filed: Mar. 25, 1988

[51] Int. Cl.[4] .............................................. G02B 6/34
[52] U.S. Cl. ............................. 350/96.19; 350/96.12; 372/45
[58] Field of Search ............... 350/96.11, 96.12, 96.13, 350/96.14; 372/45, 50, 96, 20

[56] References Cited

U.S. PATENT DOCUMENTS

| | | | |
|---|---|---|---|
| 3,760,292 | 9/1973 | Kogelnik et al. | 331/94.5 |
| 4,273,411 | 6/1981 | Alferness | 350/96.14 |
| 4,464,762 | 8/1984 | Furuya . | |
| 4,525,687 | 6/1985 | Chemla et al. | 332/7.51 |
| 4,665,528 | 5/1987 | Chinone et al. | 372/96 |
| 4,704,720 | 11/1987 | Yahaguchi | 372/96 |
| 4,716,570 | 12/1987 | Yoshida et al. | 372/96 X |
| 4,745,616 | 5/1988 | Kaneiwa et al. | 372/96 |
| 4,755,015 | 7/1988 | Uno et al. | 350/96.12 |
| 4,775,980 | 1/1988 | Chinone et al. | 372/45 X |

OTHER PUBLICATIONS

Kogelnik et al., "Coupled-Wave Theory of Distributed Feedback Lasers", Journal of Appl. Phys., vol. 43, No. 5, pp. 2327-2335 (1972).

Suematsu, Y., "Dynamic Single-Mode Semiconductor Lasers with a Distributed Reflector", J. Lightwave Tech., LT-1, 161 (1983).

Alferness, R. C. et al., "Tunable Elecro-Optic Waveguide TE-TM Converter/Wavelength Filter", Appl. Phys. Lett. 40(10) (1982).

Koch, T. L. et al., "Wavelength Selective Interlayer Directionally Grating-Coupled InP/InGaAsP", Appl. Phys. Lett. 51 (14) (1987).

Koren, U. et al., "Semi-Insulating Blocked Planar BH GaInAsP/InP Laser with High Power and High Modulation Bandwidth", Electron. Letters, vol. 24 (3), pp. 138-140 (1988).

Koch, T. L. et al., "Nature of Wavelength Chirping in Directly Modulated Semiconductor Lasers", Electronics Letters, vol. 20, No. 25-26, pp. 1038-1039 (1984).

Koren, U. e al., "InGaAs/InP Multiple Quantum Well Waveguide Phase Modulator," Appl. Phys. Lett. 50 (7), pp. 368-369 (1987).

Primary Examiner—William L. Sikes
Assistant Examiner—Akm E. Ullah
Attorney, Agent, or Firm—Samuel H. Dworetsky

[57] ABSTRACT

A grating coupler is combined with a quantum well index modulator and an optical waveguide to alter the reverse or forward coupling characteristics between two different propagation modes of the system.

9 Claims, 14 Drawing Sheets

FIG. 1

ELECTRIC-FIELD-INDUCED CHANGES IN REFRACTIVE INDEX

| MATERIAL | Δn/E(pm/V) | λ(μm) | DETUNING FROM RESONANCE (meV) | MECHANISM | E(kV/cm) |
|---|---|---|---|---|---|
| GaAs/AlGaAs QW | 371 | 0.9 | (66meV) | quadratic QCSE | 93 |
| GaAs/AlGaAs QW | 238 | 0.9 | (66meV) | quadratic QCSE | 95 |
| InGaAs/InP QW | 500 | 1.68 | (32meV) | quadratic QCSE | 90 |
| InGaAsP/InP QW | 1690 | 1.3 | (38meV) | quadratic QCSE | 130 |
| InGaAsP/InP QW | 330 | 1.54 | (54meV) | quadratic QCSE | 107 |
| InGaAsP/InP QW | 630 | 1.54 | (54meV) | quadratic QCSE | 143 |

GRATING COUPLER WITH MONOLITHICALLY INTEGRATED QUANTUM WELL INDEX MODULATOR

FIELD OF THE INVENTION

This invention involves grating couplers which are used in conjunction with index modulators to affect incident optical radiation. Specific embodiments of the invention may be used in conjunction with optical communication systems to process light and/or produce optical signals encoded in a manner representative of intelligence.

BACKGROUND OF THE INVENTION

The invention of low loss optical fibers in the early 1970s, for use as a practical optical transmission medium, stimulated explosive growth in other areas relating to optical communications. So, for example, subsequent to the development of optical fibers significant effort was directed toward the development of various optical sources and detectors. The concomitant growth of semiconductor technology led to the development of integrated sources and/or detectors which could be easily and inexpensively fabricated. (The term "optical", as used in this application, refers not only to visible light but to any electromagnetic radiation which can be transmitted effectively within dielectric fibers, usually with losses less than 2 dB/kilometer. Accordingly, the term refers to electromagnetic radiation generally of wavelength between 0.1 and 50 microns.)

Along with advances in device development, various system architectures, for use in optical communication systems, have been proposed and continue to be debated. However, many such systems require a light source which is modulated in a manner representative of intelligence. For contemplated long haul systems, such light sources must be pulsed as rapidly as billions of times per second (gigabits/sec). The pulsation may be in the form of an amplitude pulsation, e.g., "on" and "off" states, or a frequency pulsation such as, for example, frequency shift keying in which light of one frequency represents the "on" state and light of another frequency represents the "off" state. Contemplated optical sources must be considered with a view towards their ability to pulse in such a fashion at gigabit rates.

While it is possible to fabricate light sources such as injection lasers which may be inherently pulsed at gigabit rates by direct current modulation, such high pulse rates introduce deleterious spectral-broadening side effects such as "chirp" (T. L. Koch, J. E. Bowers, Electron. Lett., 20, 1038 (1984)). However, such deleterious effects can be reduced if an external modulator is used to vary the otherwise constant output of a light source, or an intracavity modulator is used in a laser, thereby yielding pulsating light representative of intelligence.

In other wavelength division multiplexed ("WDM") applications, it is contemplated that a number of different wavelength channels will be used in optical transmission or switching architectures. For these applications tunable light sources may be used, or tunable optical filtering devices might be used, to determine which wavelength channel is transmitted or received. Such devices can also be used to re-route a given signal within an optical communications network. To achieve such tunability or wavelength channel selection, most devices contemplated employ media whose index of refraction can be modulated or controlled within the device to a desired value.

Particularly useful for modulation as described in the foregoing applications are electrooptic devices whose optical properties, such as absorption or index of refraction, may be varied by application of an appropriate electrical signal. Exemplary of such electrooptical devices is the quantum well device. (In this specification the term "quantum well" refers to one or more quantum wells.)

The quantum well comprises one or more alternating layers of different semiconductor material. The layers alternate between wide bandgap material and narrow bandgap material. The valence band of the wide bandgap material is lower in energy than the valence band of the narrow bandgap material, while the conduction band of the wide bandgap material is higher in energy than the conduction band of the narrow bandgap material. The electrons and holes that are formed in the "well" regions, or that migrate to those regions, are confined to the well regions due to the lower potential energy in these regions. Such devices are called quantum well devices because for narrow wells, the electron and hole energy levels are altered by quantum effects. In the case of excitonic states, confinement of the electrons and holes within a thickness, defined by the narrow bandgap material layer thickness, that is much less than the normal exciton diameter, makes the exciton binding energy larger without further increasing the phonon broadening. This, and other consequences of this "quantum confinement" explains the persistence of the associated resonances to room temperature. In addition, the energies of the confined electrons and holes are increased as a result of the "confinement energy". One incidental consequence of the quantum confinement is that it removes the degeneracy in the valence bonds of the semiconductor, resulting in two exciton resonances, the "light hole" and the "heavy hole" exciton.

When an electric field is applied perpendicular to the quantum well layers, the optical absorption edge, including the exciton resonances, moves to lower photon energies. Normal bulk semiconductors show very little, if any, shift in absorption edge. The only consequence of applying an electric fields to a normal bulk semiconductor is the Franz-Keldysh effect which broadens the band edge with comparatively little shift. At low fields the exciton peaks broaden and disappear. However, unlike the behavior of a bulk semiconductor, when perpendicular fields are applied to a quantum well device the exciton absorption peak remains resolved to high fields.

The preservation of the exciton resonances when perpendicular fields are applied to MQW devices can be explained by considering the effect of an electrical field on a confined electron hole pair. Normally, the application of a field results in exciton broadening because of a shortening of an exciton lifetime due to ionization. However, since the confinement of the electron hole pairs due to the quantum wells precludes exciton ionization, very large fields can be applied without ionization, and therefore without broadening of the exciton resonances. Additionally, and perhaps more importantly, when the MQW device is considered for use as a modulator, there is a significant shift in the absorption edge due to the change in the confinement energy associated with the application of the electric field and the consequent distortion of the well. This shift in absorption is the basis for the MQW as a modulator. Since varying the applied field can significantly alter the light absorption properties of a properly biased MQW, light passing through the MQW will be modulated.

While the electrooptic properties of the MQW described above make it particularly appealing as an optical intensity modulator, the high degree of absorption encountered in the resonance region results in significant loss of optical energy in both the "on" and the "off" states of the modulator, which is most often undesirable, and in some applications may be untolerable. Motivated by this concern various workers have investigated the use of an MQW device as an "index" or "phase" modulator rather than an absorption modulator. The basic Kramers-Kronig relationship, which governs the interplay between the change in a material's absorption characteristics and the change in its index of refraction, dictates that large changes in index of refraction will be experienced in regions removed from the absorption edge. Accordingly, the MQW device may be used as a phase or index modulator with reduced associated absorption losses. Utilization of such an MQW phase modulator in conjunction with a Fabry-Perot laser was suggested in U.S. Pat. No. 4,525,687, issued to Chemla et al., at column 14, lines 1-19.

While early lasers were almost exclusively of the Fabry-Perot type cited by Chemla et al., subsequent developments suggested lasers with distributed reflectors, most often fabricated within a waveguiding structure. U.S. Pat. No. 3,760,292 discusses the operation of a distributed feedback laser. Such a laser is based on the phenomenon of "grating coupling". This phenomenon is associated with the passage of light through a region of varying transmission properties, periodic in at least one dimension, i.e., a "grating". The interaction of light with such gratings involves a phase matching condition which is only satisfied at certain wavelengths. As is well known by those skilled in the art, wavelengths for which the phase matching condition is satisfied are given by the different "orders" of grating coupling. When coupling occurs at the longest wavelength $\lambda_0$ which satisfies the phase matching condition, the coupling is referred to as "first order". Other wavelengths which may also satisfy the phase matching condition, are $\lambda_0/M$ where $M = 2, 3, 4 \ldots$ are the higher orders of operation. In this application the grating is generally considered to be operating in "first order" ($M = 1$) but may operate in higher orders. Representative of such "gratings" are regions of varying index of refraction or a corrugation in the boundary between two materials of different index of refraction. When light passes through such a region it may be either forward or reverse coupled to other guided waves. Exemplary of such "grating coupling" is the Bragg reflector—a "grating coupler" which reverse couples incoming light to a "reflected", outgoing, light beam. The Bragg reflector may be fabricated external to a gain medium resulting in a Distributed Bragg Reflecting (DBR) laser. A "grating coupler" may also be fabricated as an integral part of the gain material resulting in a Distributed Feed Back (DFB) laser. The grating coupler in a DFB laser may be viewed heuristically as simply a reflector which defines the laser cavity. However, rigorous analysis shows that the coupling in a DFB laser is more complicated because of phase effects. So, for example, the DFB does not lase at the center of the "Bragg reflection band" but rather near its two first minima.

The quantum well device and the distributed feedback laser have been combined to yield devices such as quantum well lasers. The quantum well laser utilizes the electronic properties of the quantum well to define energy levels which are particularly advantageous for use as laser transitions.

SUMMARY OF THE INVENTION

This invention is founded on the realization that particularly advantageous devices may be realized when a grating coupler is combined with a reverse biased quantum well index modulator in a monolithically integrated structure. The structure may comprise one or more optical waveguides to provide lateral and/or vertical confinement of the light passing through the structure. The combination of the coupler and modulator provides for an additional degree of design freedom which may be used to alter the reverse or forward coupling characteristics between two different propagation modes of the system, thereby resulting in new and beneficial structures. Embodiments of the invention include (1) a distributed feedback laser with an intracavity reverse biased quantum well index modulator, (2) a tunable quantum well Bragg reflector, (3) a tunable, reverse coupling, grating filter, (4) a tunable, forward coupling, grating filter, and (5) a quantum well index modulator integrated with a grating coupler to provide a phase adjustable wavelength selective coupling device. These devices may be advantageously used in optical devices to provide light with characteristics suitable for use in optical communication systems.

BRIEF DESCRIPTION OF THE DRAWING

FIG. 1 represents measurements of the field induced change of the refractive indices of quantum well devices, composed of different material systems, measured at a particular voltage and wavelength.

DETAILED DESCRIPTION

Since an aspect of the invention involves a combination of a grating coupler and a quantum well index modulator, it would be helpful for a more complete understanding of the invention to discuss the phenomena of quantum well index modulation and grating coupling before discussing specific embodiments of the invention. Accordingly, in what follows we will discuss those two critical phenomena and then discuss specific embodiments of the invention.

A. Quantum Well Index Modulation

The invention is inspired in part by our realization that for quantum well devices an extended region of operation exists which is sufficiently removed from the absorption peak to yield reduced optical losses, while at the same time yielding significant modulation in index of refraction upon application of an external field. Such preferred regions of operation exist in most, if not all, semiconductor quantum well structures. We have experimentally identified such regions for semiconductor quantum well structures involving specific combinations of binary, ternary and/or quaternary materials.

We have determined that for a fixed applied field the magnitude of the change of the index of refraction induced by the application of an electric field to the quantum well device varies inversely with the detuning, DW, from the ground state exciton resonance. That result can be expressed mathematically as follows:

$$\Delta n \sim 1/\Delta \omega \quad (1)$$

We have also determined that for a fixed detuning from the ground state exciton resonance, the magnitude of the change in index of refraction induced by the application of an electric field to the quantum well device varies proportionately with the square of the electric field applied to the device. That result can be expressed mathematically as follows:

$$\Delta n \sim E^2 \quad (2)$$

Lastly we have determined that for most if not all semiconductor quantum well devices, there exists a general relationship between the field induced change in index of refraction, the amount of detuning and the square of the applied electric field given by $$\left(\frac{\Delta n}{E}\right)\left(\frac{\Delta \omega}{E}\right) = \kappa \quad (3)$$

where $\kappa$ is between one hundred and five hundred when $(\Delta n)/E$ is given in picometers per volt and $(\Delta \omega)/E$ is given in (meV·cm)/(KV). Equation 3 makes it possible to predict for any quantum well device the field induced index change as a function of wavelength and/or applied field based on a single measurement of the field induced change of refractive index at a particular voltage and wavelength. For quantum well devices composed of several different material systems, FIG. 1 represents such single measurements of the field induced change of the refractive index at a particular voltage and wavelength. Accordingly, from these results we can predict the field induced change in index of refraction for these quantum well devices as a function of wavelength and/or applied field.

Figure 2:
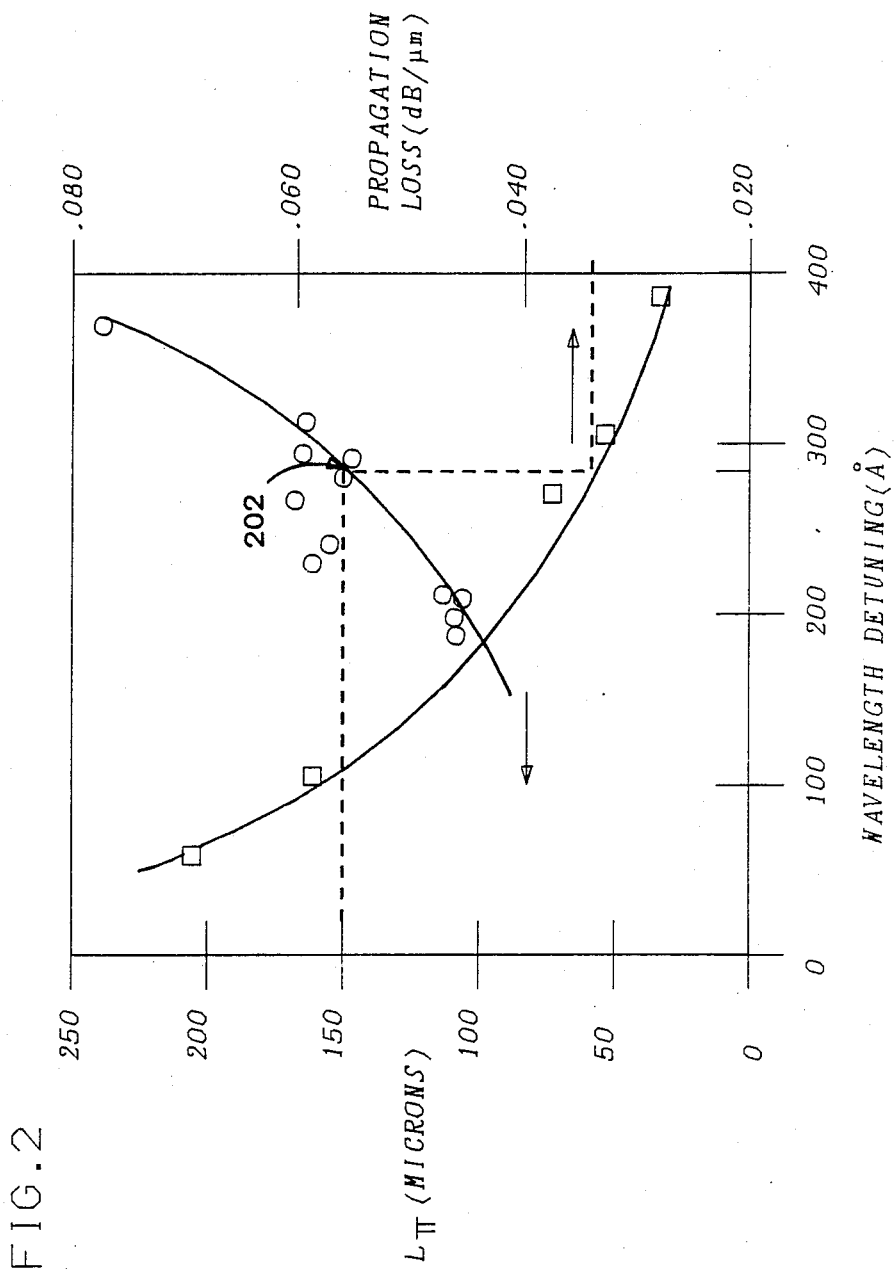
FIG. 2 is a schematic representation of the behaviour of the absorption loss and field induced change in index of refraction as a function of a detuning from the excitonic resonance peak.

Since the magnitude of the field induced change in index of refraction varies inversely with detuning from the ground state exciton resonance, while the absorption loss falls exponentially with the same detuning from resonance, we have determined that there exists an extended region of wavelength operation for which the application of a field to the quantum well device results in significant modulation of the index of refraction while at the same time involving only minimal absorption losses. FIG. 2 is exemplary of this trade-off between absorption loss and the field induced change in index of refraction. In this figure detuning is plotted on the abscissa axis while the right hand ordinate measures the propagation loss and the left hand ordinate measures the phase change associated with the field induced change in index of refraction. The left hand ordinate is measured in units of length necessary to obtain a change of $\pi$ in phase. In this figure a voltage of 10 volts was applied over a one micron intrinsic region, i.e., a field of 100 kV/centimeter. This length is given by $$L_\pi = \lambda/2\Delta n \quad (4)$$

As shown by the graph a phase change of $\pi$ may be obtained in a device of 150 micron length and in such a device the propagation loss is less than 5 dB.

Prior art devices have been effectively operated with 5 dB absorption losses, leading to the conclusion that such losses are acceptable. However, with the use of gain devices it may be possible to operate with even greater absorption losses. Accordingly, while the inventive device will usually be operated below the excitonic absorption peak, and most often the operational range will be greater than $4\Gamma$, where $2\Gamma$ is the full width at $e^{-\frac{1}{2}}$ point of the lowest line excitonic absorption peak, the use of gain devices may enable operation closer to the resonance peak, perhaps even as close as $1\Gamma$ or $2\Gamma$. Depending on the optical polarization relative to the growth direction of the quantum well layers, the lowest line excitonic peak will be the light hole exciton in TM polarization or the heavy hole exciton in TE polarization. Additional details relating to our observations concerning the relationship between the field induced change of index of refraction and absorption loss may be found in "Low Voltage Phase Modulation in GaAs/AlGaAs Quantum Well Optical Waveguides", Electronics Letters, Vol. 24, No. 2, p. 112, Jan. 1, 1988.

B. Grating Couplers

In the inventive device a reverse biased quantum well index modulator is combined with a grating coupler to vary the phase of coupled light or the wavelength at which such coupling occurs. The pitch of the grating is designed to give phased matched grating coupling in a wavelength range which is substantially below the absorption edge of the quantum well device thereby insuring operation of the quantum well index modulator in the preferred index region. In accordance with the above, the term "substantially below the absorption edge" refers to detuning values greater than $3\Gamma$. However, commercially valuable devices may be designed to operate further from the resonance peak than $5\Gamma$, $7\Gamma$ or even $10\Gamma$.

Prior art devices have involved coupling between various propagation modes. The term "coupling" as used here refers to a transfer of power between two or more propagation modes of a guided wave structure. In the grating coupler, the grating provides phase matching to allow for the coupling of two propagation modes, which, in the absence of the grating, would not be phase matched, and therefore would not be coupled. The term "propagation mode" as used here, is consistent with the term commonly used in the art, and refers to a forward or reverse propagating wave, whose relative intensity distribution perpendicular to the direction of propagation is largely independent of the distance along the direction of propagation. For example, two propagation modes which may be coupled by a grating are two different spatial modes of a guided wave structure, or two different polarization modes, or a forward and reverse version of the same spatial mode. The terminology used here classifies the forward and reverse versions of a given spatial mode as two distinct propagation modes. As indicated above, the term "grating" as used here refers to a region of varying transmission properties, periodic in at least one dimension. Such gratings include regions of varying index of refraction or regions including a corrugated boundary between media of different indices of refraction.

Two modes which are coupled by a grating, in general, have different propagation constants $\beta_1$ and $\beta_2$. In order to effect coupling from mode one to mode two, the grating must provide phase matching, as given by $$\beta_2 = \beta_1 \pm \frac{2\pi}{\Lambda_g} \cdot M \tag{5}$$

where $\Lambda_g$ is the spatial period of the grating or its "pitch", and $M = 1, 2, 3 \ldots$ is the "order" of coupling. In most embodiments, the grating coupler has a pitch which yields phase matched grating coupling with $M = 1$, i.e., first order, in a wavelength range which is energetically substantially below the absorption edge of the quantum well device. Mode propagation constants may also be characterized by an "effective index" defined as $n_{eff} = (\beta \cdot \lambda)/(2\pi)$. Accordingly, to effect coupling between the forward and reverse versions of a particular spatial mode with an effective index $n_{eff1}$ the phase matching requirement above would demand that the grating pitch $\Lambda_g$ satisfy $$\Lambda_g = \frac{\lambda}{2 \cdot n_{eff1}} \tag{6}$$

where $\lambda$ is the wavelength where phase matched coupling is desired. As another example, to effect coupling between two distinct forward propagating modes with respective effective indices $n_{eff1}$ and $n_{eff2}$, where $n_{eff1}$ is greater than $n_{eff2}$, a grating with a pitch $$\Lambda_g = \frac{\lambda}{n_{eff1} - n_{eff2}} \tag{7}$$

would be required where again $\lambda$ is the wavelength where phase matched grating coupling is desired.

Prior art examples of grating coupled devices include the distributed feedback laser (H. Kogelnik and C. V. Shank, Appl. Phys., 43, 2327 (1972)), U.S. Pat. No. 3,760,292, distributed Bragg reflector lasers (Y. Suematsu, S. Arai and K. Kishino, J. Lightwave Tech., LT-1, 161 (1983), lithium niobate TE-TM mode converter filters (R. C. Alferness and L. L. Buhl Appl. Phys. Lett., 40, 861 (1982), U.S. Pat. No. 4,273,411) and monolithic vertical grating coupling (T. L. Koch, P. J. Corvini, W. T. Tsang, U. Koren and B. I. Miller, Appl. Phys. Lett., 51, 1060 (1987)).

C. Specific Embodiments of the Invention

Specific embodiments of the invention as described below include (1) a distributed feedback laser with an intracavity reverse biased quantum well phase modulator, (2) a tunable quantum well Bragg reflector, (3) a tunable, reverse coupling, grating filter, (4) a tunable, forward coupling, grating filter, and (5) a quantum well index modulator integrated with a grating coupler to provide a phase adjustable wavelength selective coupling device.

1. A Distributed Feedback Quantum Well Laser with An Intracavity Phase Modulator This embodiment is a quantum well laser with four additional quantum wells that are used for index, and thus phase modulation. In this embodiment a quantum well phase modulator is incorporated in the center of a quantum well distributed feedback laser cavity. Using this embodiment we have measured the optical phase shift in the modulator section as a function of the applied voltage for both reverse bias, which results in field induced index change, and also with for forward bias which results in the injection of carriers into the quantum wells and may also change the index. (Such forward bias operation is not limited to this embodiment but may also be practiced within the spirit of this invention in the other embodiments of this invention.)

This embodiment is a particularly useful single mode laser. Since the longitudinal mode behaviour of the distributed feedback laser is controlled by the central phase shift, single mode operation can be obtained by adjustment of the modulator bias. Additionally, since the electrooptical effect permits high speed modulation, this embodiment may be used where high speed FM modulation of lasers or high speed switching of frequencies is required such as, for example, in frequency shift keyed architectures.

A device representative of this embodiment comprises two stacks of quantum wells with 80 A and 60 A thicknesses for use as the laser and modulator sections respectively. The laser waveguide incorporated both stacks of quantum wells while the modulator waveguide included only the thinner 60 A QW stack as the other QW's have been etched away at this section. This design concept takes advantage of the fact that the laser is operating at a wavelength corresponding to the lower energy gap of the thicker (80 A) QW's and at this wavelength the thinner (60 A) wells are relatively transparent. However, the excitonic absorption band edge of the 60 A well is about 70 nm shorter than the lasing wavelength and it can be strongly shifted by the applied electrical field. Therefore, large variations in both the refractive index and the electroabsorption can be induced in the modulator section. Using both forward and reverse biasing on the modulator section, which was 80 micron long, we have measured phase shifts of up to about 650 degrees. This corresponds to an effective refractive index change $\Delta n/n$ of about 1% which, to our knowledge, is the highest index change yet reported for a QW-separate confinement heterostructure waveguide in this material system.

Figure 3:
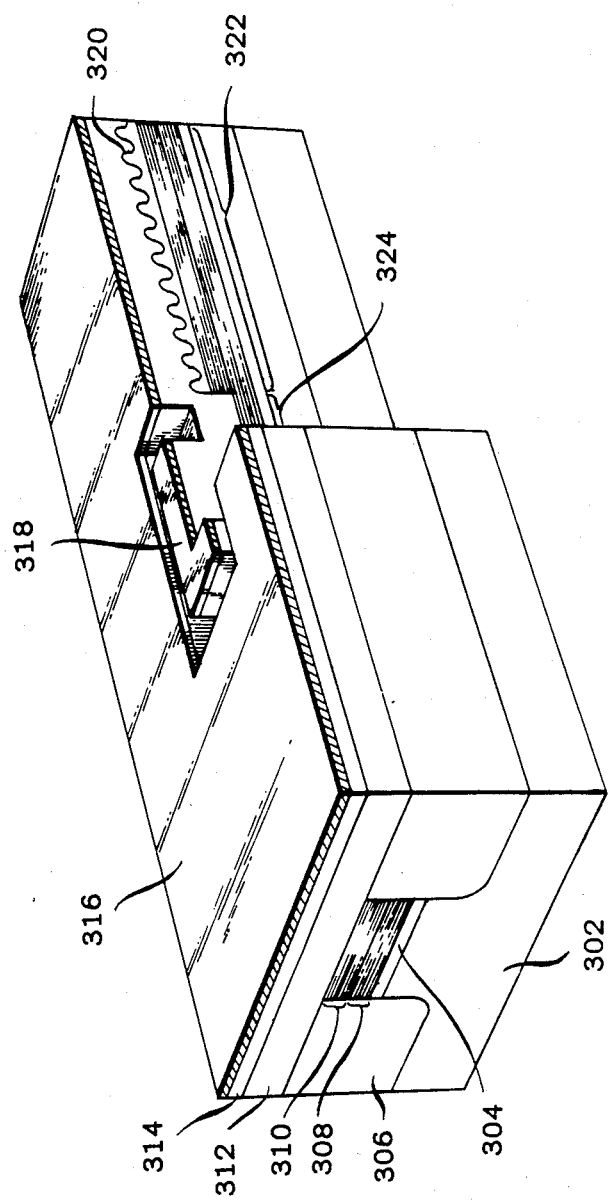
FIG. 3 is a schematic representation of an embodiment of the invention comprising a distributed feedback quantum well laser with an intracavity index modulator.

The complete device structure is shown in FIG. 3. The base wafer was grown by atmospheric pressure metal organic vapor phase deposition (MOCVD). The waveguide part was composed of a 2500 A thick 1.3 micron InGaAsP layer. Following this layer two stacks of four QW's were grown. The first stack was composed of four InGaAs QW's 60 A thick separated by 100 A InGaAsP barriers. Following this stack a 250 A InP stop-etch layer was grown followed by the second stack of four 80 A QW's separated by 100 A InGaAsP barriers. The last layer grown was a 1.3 wavelength 1500 A thick InGaAsP waveguide layer.

After the epitaxial growth, a first order grating coupler was formed holographically on the top of the last waveguide layer. This waveguide layer and the top 80 A QW stack were then removed at the modulator section (see FIG. 3) by selective chemical etching down to the InP stop-etch layer.

The rest of the processing steps were similar to those used for fabricating a semi-insulating blocked planar buried heterostructure (SIPBH) laser. (See Koren et al., Electronics Letters, Vol. 24, page 138 (1988)). This technique uses two epitaxial regrowth steps by MOCVD for the blocking semi-insulating layers and for the top cladding and cap layers. Finally, two electrodes were formed for the laser and modulator parts as shown in FIG. 3. The electrodes were separated by chemically etching through the cap and most of the cladding layer resulting in about 200 ohms resistance between the two electrodes.

The devices were cleaved and mounted p-side up on copper studs. The total cavity length was 500 micron while the central modulator section was 80 micron long. The devices were operated as cleaved without anti-reflection or high reflectivity coatings on the mirrors.

Figure 4:
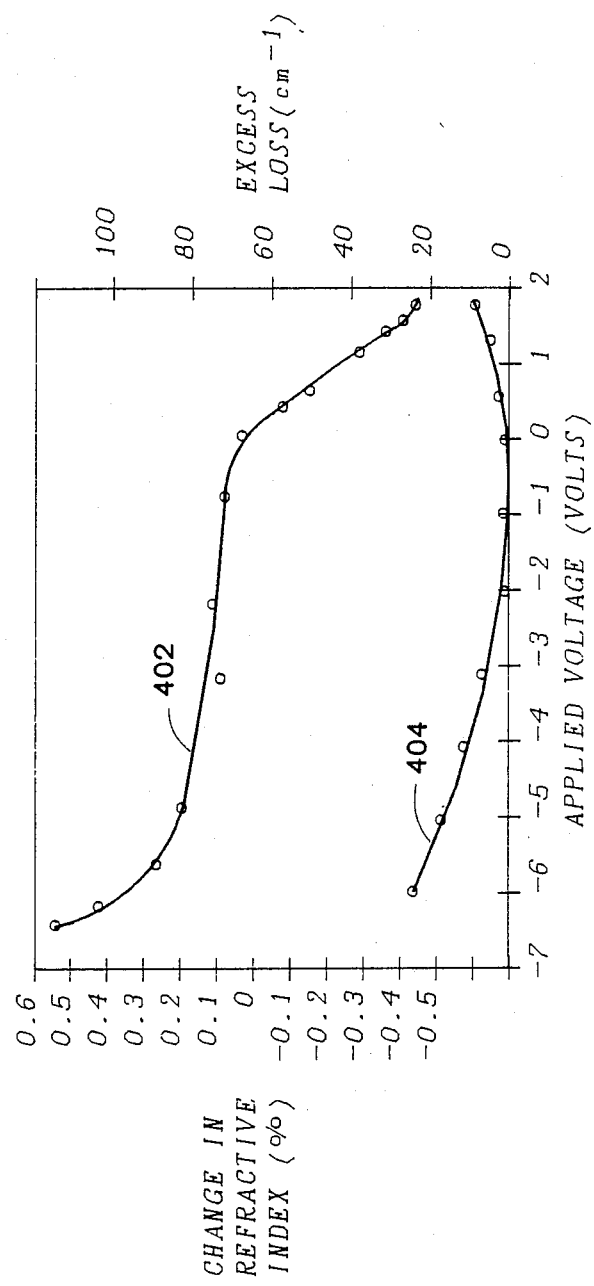
FIG. 4 is a schematic representation of the change in the effective refractive index and the associated induced excess loss of the modulator waveguide shown in FIG. 3 as a function of applied voltage.

The change in the effective refractive index of the modulator waveguide as a function of the applied voltage on the modulator electrode is shown in FIG. 4. The induced phase shift was measured as described in Koren et al., Applied Physics Letters, Vol. 50, page 368 (1987). The technique involves driving the laser below threshold so that one can monitor the spectral shift in the Fabry-Perot modes as a function of the modulator voltage. A phase shift of $1\pi$ corresponds to a shift in the spectrum of one complete cycle causing it to overlap with the original mode spectrum. The excess optical loss that is added to the cavity as the modulator bias voltage is varied from zero is also shown in FIG. 4. This loss was derived from the change in contrast of the Fabry-Perot modes. It should be noted that a relatively large change of more than 1% in the effective refractive index was obtained while the excess loss remained smaller than 40 cm$-1$.

Figure 5:
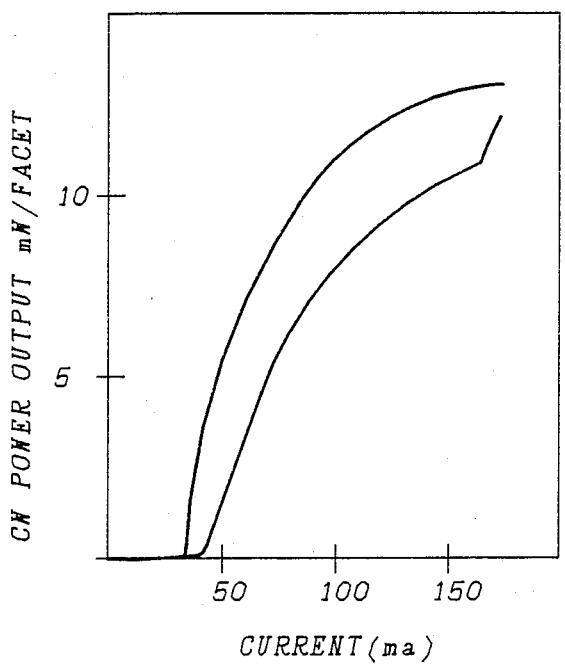
FIG. 5 is a schematic representation of the light current characteristics for the single and double mode operation of the laser.
Figure 6:
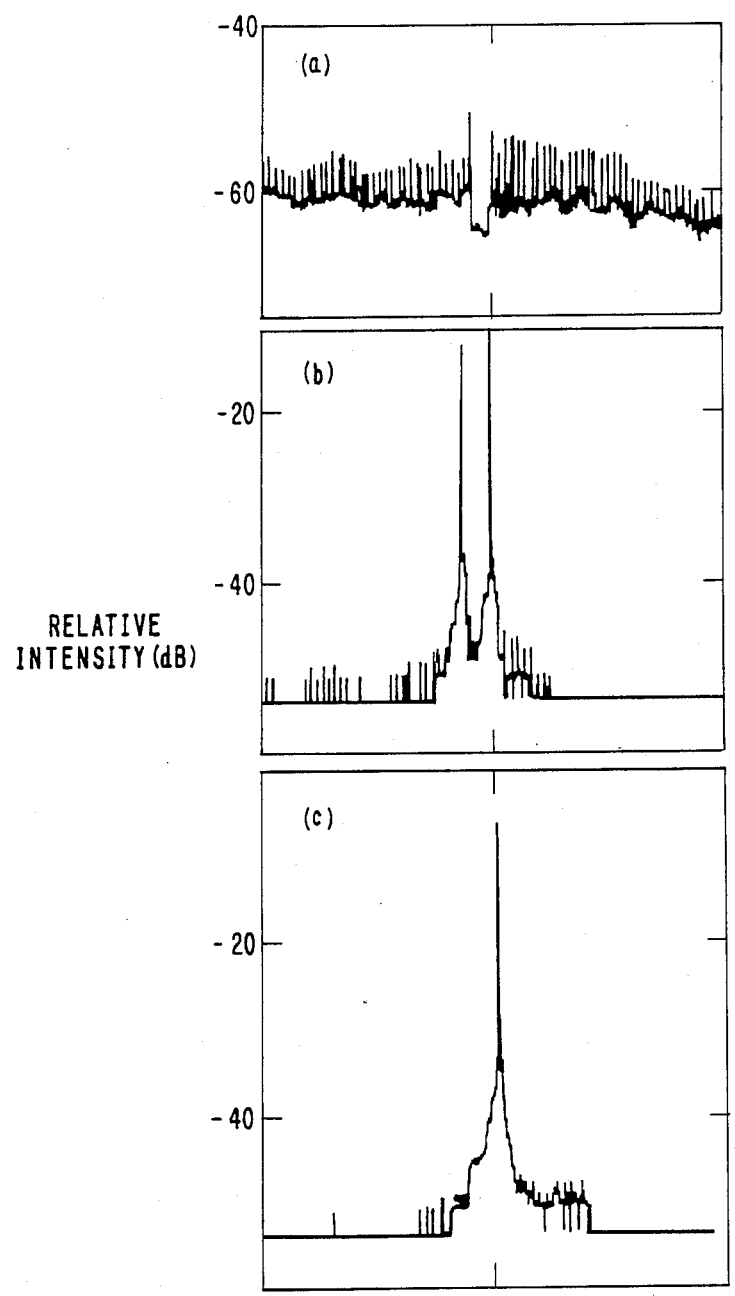
FIG. 6 is a schematic representation of the spectral behaviour of the laser below and above threshold for the single mode and double mode states.

The dominant effect of the modulator voltage on the operation of the DFB laser is to switch repeatedly (at several different modulator voltages) between single and double mode operation of the laser. The light current characteristics for these two states are shown in FIG. 5. The current threshold for single mode DFB operation is about 10 ma lower than for double mode DFB operation, and at single mode operation output power of above 10 mW/Facet was obtained. The spectral behaviour below and above threshold at these two states is shown in FIG. 6. The stop band is clearly seen below threshold and the laser can be switched between single or double mode operation by the modulator voltage. A similar switching behaviour has been observed previously using variation of the current ratio in two electrode lasers. It should be noted that with fine adjustment of the modulator voltage single mode operation with side mode suppression better than 40 dB was obtained (FIG. 4c).

The switching behaviour described above was obtained when the DFB Bragg wavelength was near to the gain peak of the laser. However, when the Bragg wavelength was significantly longer than the gain peak (detuned by 15 nm or more) then we observed switching between DFB single mode operation and Fabry-Perot operation. Again, switching between these two states occurred several times as the modulator voltage was varied. This kind of switching behaviour is expected, and indicate that the threshold for Fabry-Perot operation can be lower, with detuning, than for double mode DFB operation.

Figure 7:
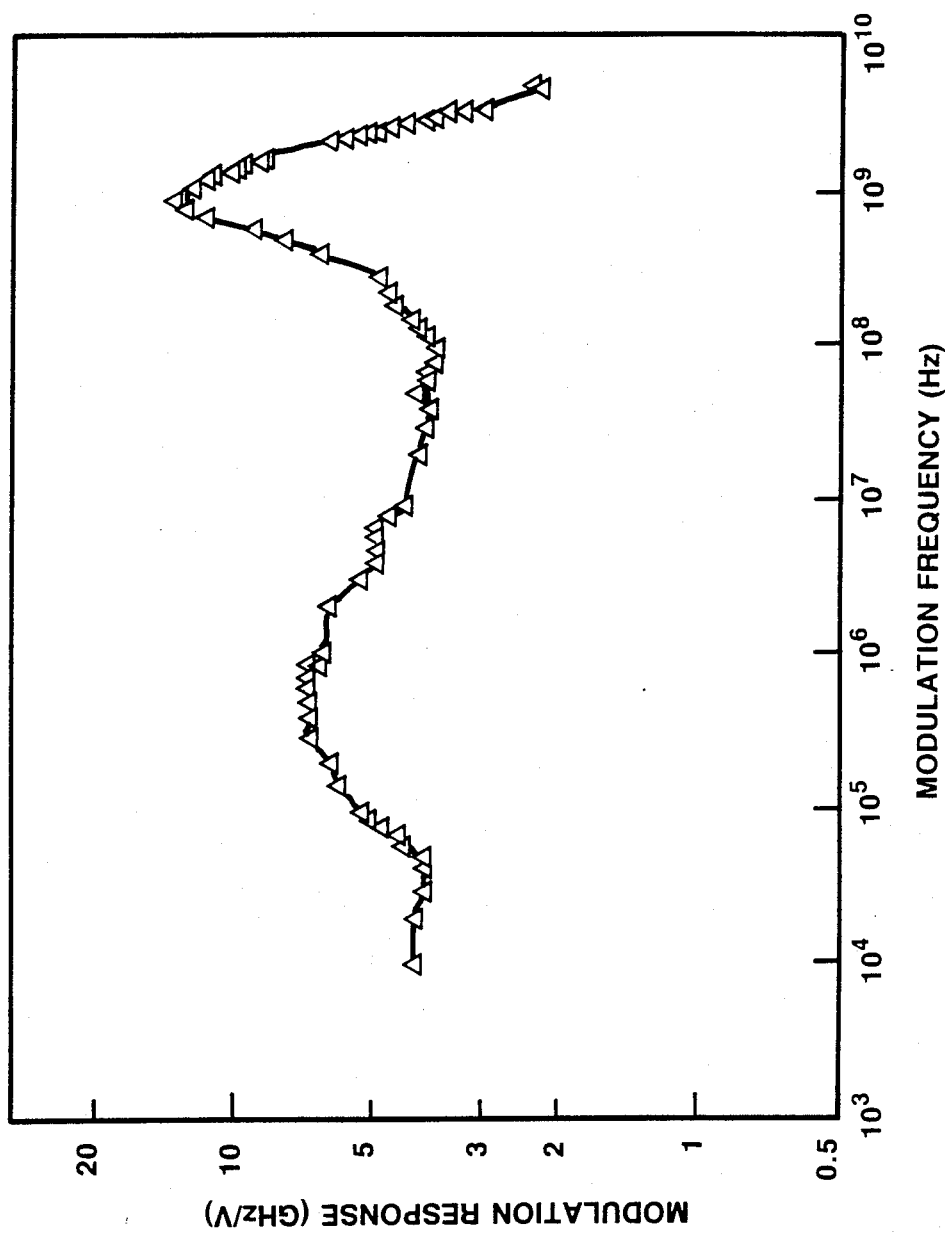
FIG. 7 is a schematic representation of the frequency modulation response versus modulation frequency for the intracavity index modulated DFB laser.

FIG. 7 shows the frequency modulation (FM) response in GHz/V as a function of modulation frequency of the signal applied to the phase modulator electrode of the intracavity phase modulated DFB laser. This was measured with a Fabry-Perot interferometer and demonstrates substantial FM response at GHz modulation speeds.

2. Tunable Quantum Well Bragg Reflectors

Figure 8:
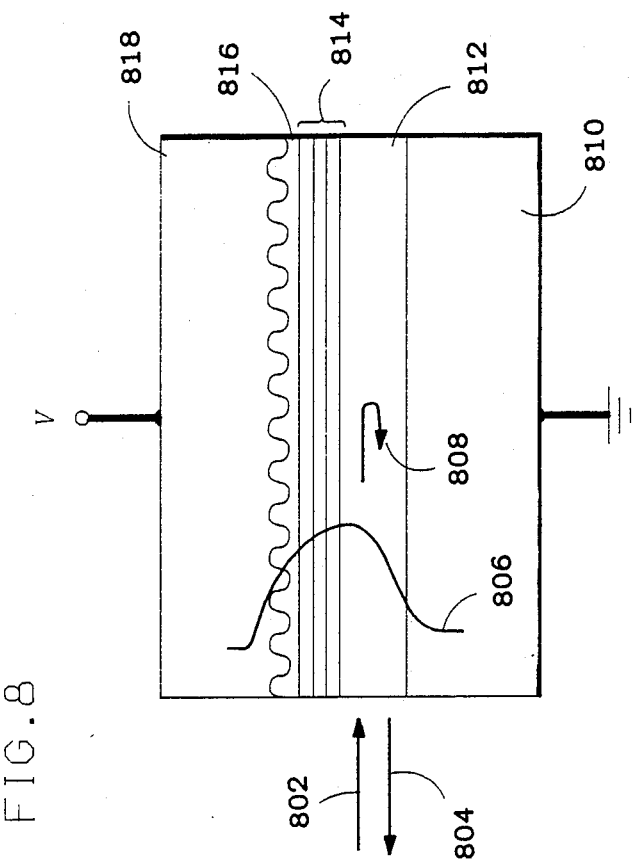
FIG. 8 is a schematic representation of an embodiment of the invention comprising a tunable quantum well Bragg reflector

In this embodiment a grating, a quantum well and a waveguiding structure are monolithically fabricated and oriented spatially so that the forward and reverse versions of a particular optical mode of the waveguiding structure spatially overlap both the grating and the quantum well. In the most common embodiments the waveguiding structure will be placed vertically adjacent to the quantum well and the coupler. In the most common embodiment the grating will be a corrugation in the interface between two different index materials. The most common application of this device will be to provide a narrow band reflection filter whose center reflection wavelength may be varied by varying the index of the quantum well material, usually by applying an appropriate electric field. This embodiment is shown schematically in FIG. 8. Provided the quantum well material overlaps the propagating mode in question the effective index of this mode will be altered when the quantum well material index is altered. The tuning thus follows directly from Equation (6). This embodiment may be used as "mirror" in a novel tunable DBR laser, or in a novel tunable resonant DBR amplifier.

3. A Tunable, Reverse Coupling, Grating Filter

Figure 9:
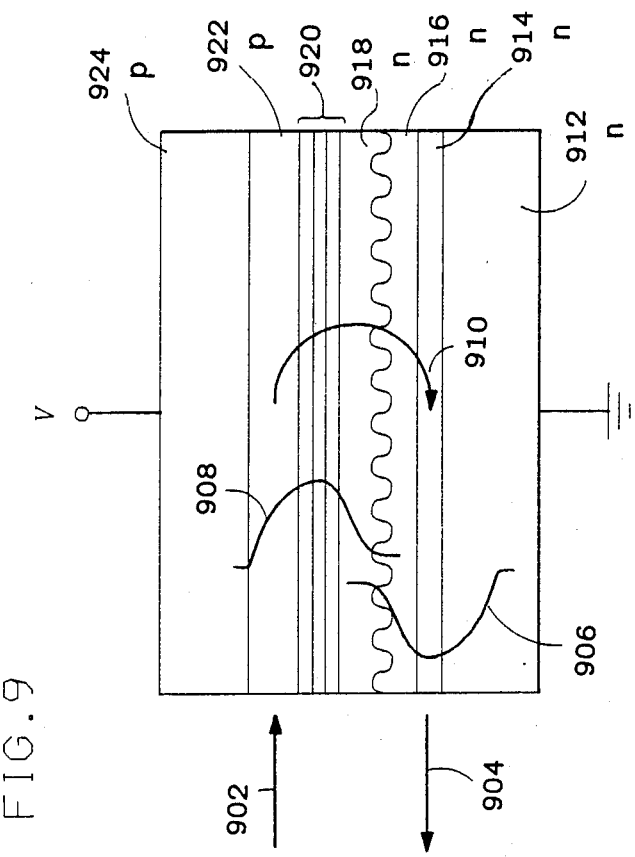
FIG. 9 is an embodiment of the invention comprising tunable reverse coupling grating filters.

This embodiment is substantially similar to embodiment number two above, but rather than coupling between the forward and reverse versions of a particular optical mode, the grating couples between a forward version of one particular mode and a backward version of another particular mode. A specific version of this embodiment will involve a waveguiding structure which supports two vertically separated spatial modes with different propagation constants and a grating which will couple both modes usually as a result of its spatially overlapping both modes. This embodiment is shown schematically in FIG. 9. A related prior art device which does not involve quantum wells is described in "Wave Length Selective Interlayer Directionally Grating-Coupled InP/InGaAsP Waveguide Photodetection," Appl. Phys. Lett., 51, 1060 (1987). In the particular example of this embodiment shown in FIG. 9, a quantum well layer overlaps at least one of the two spatial modes shown. When the index of the quantum well layer is varied with an applied voltage, one or both of the respective mode's effective indices $n_{eff1}$ and $n_{eff2}$ may be altered. This has the effect of changing the coupling wavelength in accordance with Equation (5) which in this embodiment becomes $$\lambda = \Lambda_g \cdot (n_{eff1} + n_{eff2}) \tag{8}$$

4. A Tunable, Forward Coupling, Grating Filter

Figure 10:
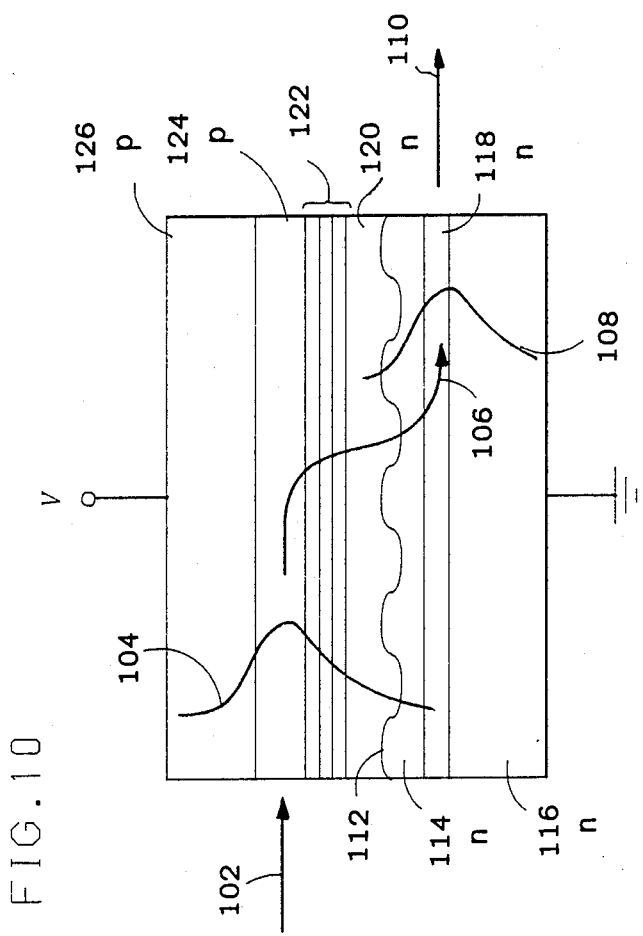
FIG. 10 is a schematic representation of the invention comprising tunable forward coupling grating filters.

This embodiment, shown schematically in FIG. 10, is substantially the same as embodiment three above except the two coupled modes are both forward propagating. In accordance with Equation (7) the pitch of the grating required for forward coupling is substantially coarser than that required in reverse coupling. The phase matching wavelength for this embodiment becomes $$\lambda = \Lambda_g \cdot (n_{eff1} - n_{eff2}) \tag{9}$$

Figure 11A:
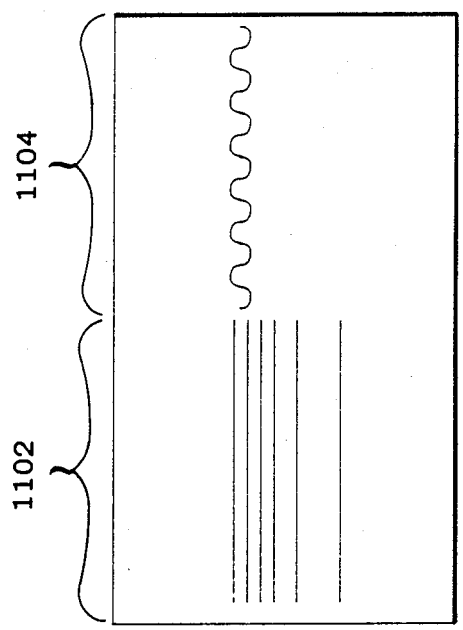
FIGS. 11(A)-(D) are a schematic representation of the embodiment of the invention comprising a quantum well index modulator integrated with a grating coupler to provide a phase-adjustable wavelength selective coupling device.
Figure 11B:
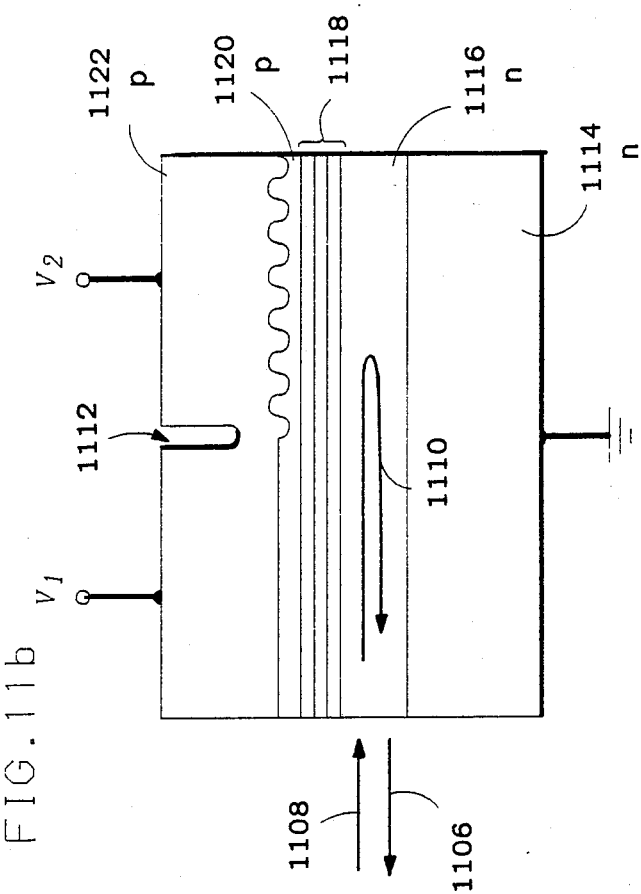
Figure 11C:
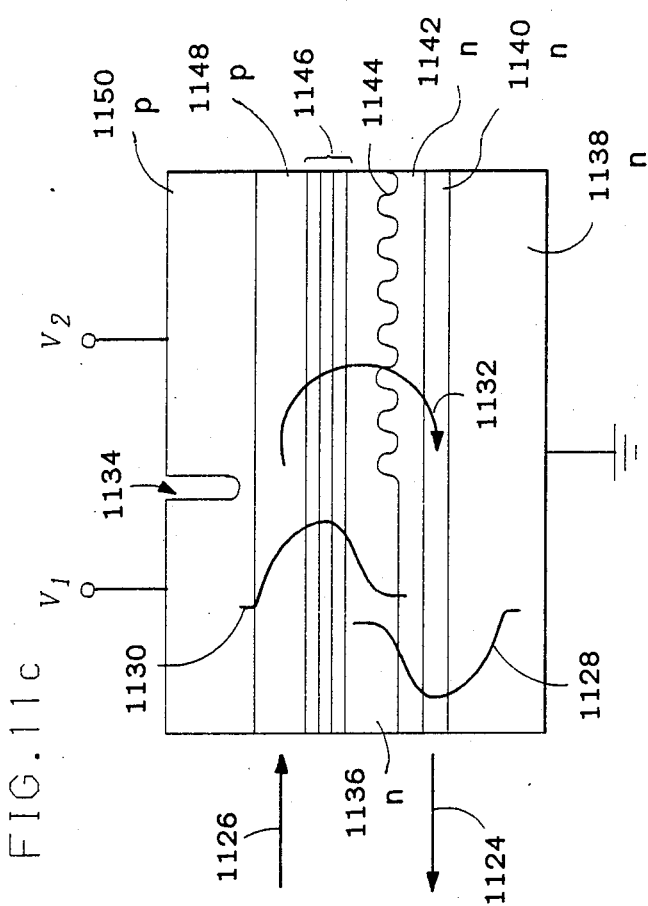
Figure 11D:
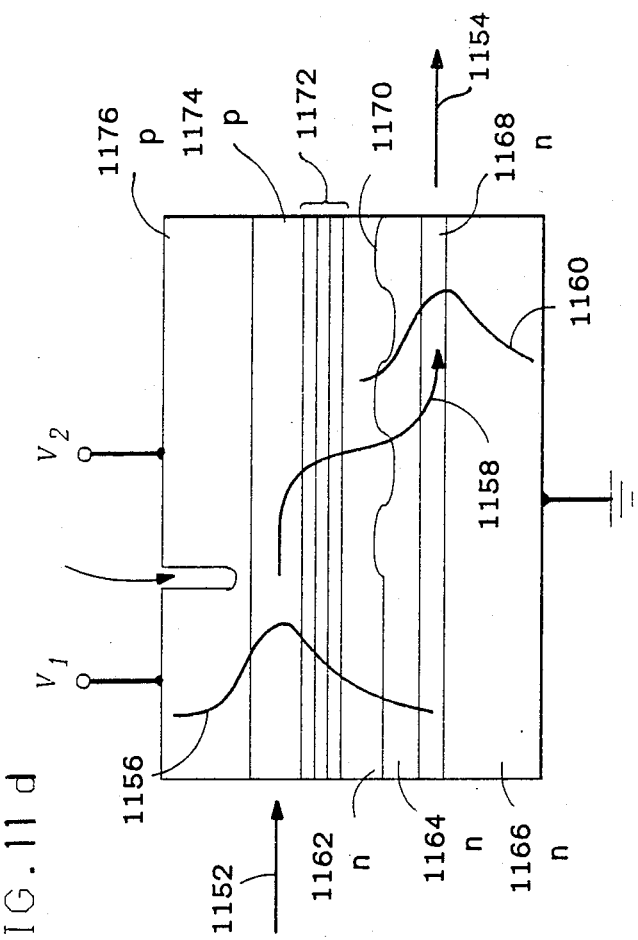

5. A Quantum Well Index Modulator Integrated With a Grating Coupler To Provide a Phase Adjustable Coupling Device In general, this embodiment involves a grating coupler with a spatially separated quantum well index modulator which may be used to alter the phase of the coupled light. The phase is altered by providing a length of propagation in a quantum well medium whose index has been altered, by application of an electric field, either before or after the coupling has occurred. The grating coupler itself may or may not also include a quantum well index modulator as in the embodiments one through four above. Accordingly, FIG. 11 shows five specific examples of this embodiment. FIG. 11a is a generic schematic diagram of this embodiment while FIGS. 11b through 11d are specific examples of this embodiment analogous to embodiments one through four above.

What is claimed is:

1. A device comprising
   (a) a quantum well structure,
   (b) a guided wave structure, and
   (c) a grating coupler designed to couple at least two propagation modes of the guided wave structure,
   the invention characterized in that,
   the grating coupler has a pitch which yields phase matched grating coupling in a wavelength range which is energetically substantially below the absorption edge of the quantum well device.

2. The device of claim 1 wherein the quantum well structure comprises more than one quantum well.

3. The device of claim 2 further comprising a source of optical radiation of a wavelength which is substantially below the absorption edge of the quantum well device.

4. The device of claim 1 wherein the quantum well device is located within the cavity of a distributed feedback laser.

5. The device of claim 1 wherein the grating, the quantum well, and the waveguiding structure are oriented so that the forward and reverse versions of a particular optical mode of the waveguiding structure spatially overlap both the grating and the quantum well structure thereby yielding a tunable quantum well Bragg reflector.

6. The device of claim 1 wherein the grating, the quantum well, and the waveguiding structure are oriented so that the forward version of a particular optical mode of the waveguiding structure and the backward version of a different particular optical mode of the waveguiding structure spatially overlap both the grating and the quantum well structure thereby yielding a tunable, reverse coupling grating filter.

7. The device of claim 1 wherein the grating, the quantum well, and the waveguiding structure are oriented so that a forward version of a first particular optical mode of the waveguiding structure and a forward version of a second particular optical mode of the waveguiding structure spatially overlap both the grating and the quantum well structure thereby yielding a tunable, forward coupling grating filter.

8. The device of claim 1 wherein the grating coupler is spatially separated along the waveguide direction from the quantum well device.

9. The device of claim 1 wherein the grating coupler has a pitch which yields phase-matched grating coupling in a wavelength range which is energetically greater than $5\Gamma$ below the absorption edge of the quantum well device.

* * * * *